(12) United States Patent
Nondhasitthichai et al.

(10) Patent No.: US 9,099,317 B2
(45) Date of Patent: Aug. 4, 2015

(54) METHOD FOR FORMING LEAD FRAME LAND GRID ARRAY

(75) Inventors: Somchai Nondhasitthichai, Bangkok (TH); Saravuth Sirinorakul, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 0 days.

(21) Appl. No.: 12/383,135

(22) Filed: Mar. 19, 2009

(65) Prior Publication Data

US 2009/0209064 A1 Aug. 20, 2009

Related U.S. Application Data

(62) Division of application No. 11/731,522, filed on Mar. 30, 2007, now Pat. No. 8,310,060.

(60) Provisional application No. 60/795,929, filed on Apr. 28, 2006.

(51) Int. Cl.
*H01L 21/00* (2006.01)
*H01L 23/00* (2006.01)
(Continued)

(52) U.S. Cl.
CPC .............. *H01L 24/06* (2013.01); *H01L 21/561* (2013.01); *H01L 21/565* (2013.01); *H01L 21/568* (2013.01); *H01L 21/6835* (2013.01); *H01L 23/3107* (2013.01); *H01L 23/495* (2013.01); *H01L 23/4951* (2013.01); *H01L 23/49513* (2013.01); *H01L 23/49541* (2013.01); *H01L 23/49548* (2013.01); *H01L 23/49572* (2013.01); *H01L 23/49575* (2013.01); *H01L 24/32* (2013.01); *H01L 24/94* (2013.01); *H01L 24/97* (2013.01); *H01L 25/0657* (2013.01); *H01L 25/50* (2013.01); *H01L 24/28* (2013.01);

*H01L 24/29* (2013.01); *H01L 24/48* (2013.01); *H01L 24/81* (2013.01); *H01L 24/85* (2013.01); *H01L 2224/0401* (2013.01); *H01L 2224/04026* (2013.01); *H01L 2224/16245* (2013.01); *H01L 2224/32014* (2013.01); *H01L 2224/32057* (2013.01); *H01L 2224/32145* (2013.01); *H01L 2224/32245* (2013.01); *H01L 2224/48091* (2013.01); *H01L 2224/48227* (2013.01); *H01L 2224/48237* (2013.01);
(Continued)

(58) Field of Classification Search
CPC ............ H01L 2924/01079; H01L 2924/15311
USPC ........................................................ 438/109
See application file for complete search history.

(56) References Cited

U.S. PATENT DOCUMENTS 3,611,061 A 10/1971 Segerson
4,411,719 A 10/1983 Lindberg
(Continued)

OTHER PUBLICATIONS

U.S. Appl. No. 11/788,496, Somchai Nondhasitthichai et al.
(Continued)

*Primary Examiner* — Mamadou Diallo
*Assistant Examiner* — Jay C Chang
(74) *Attorney, Agent, or Firm* — Haverstock & Owens LLP

(57) ABSTRACT

A package includes a first plated area, a second plated area, a die attached to the first plated area, and a bond coupling the die to the second plated area. The package further includes a molding encapsulating the die, the bond, and the top surfaces of the first and second plated areas, such that the bottom surfaces of the first and second plated areas are exposed exterior to the package. Additional embodiments include a method of making the package.

25 Claims, 11 Drawing Sheets

(51) Int. Cl.
  *H01L 21/56* (2006.01)
  *H01L 21/683* (2006.01)
  *H01L 23/31* (2006.01)
  *H01L 23/495* (2006.01)
  *H01L 25/065* (2006.01)
  *H01L 25/00* (2006.01)

(52) U.S. Cl.
  CPC ............ *H01L 2224/48247* (2013.01); *H01L 2224/48257* (2013.01); *H01L 2224/48465* (2013.01); *H01L 2224/73265* (2013.01); *H01L 2224/81801* (2013.01); *H01L 2224/83001* (2013.01); *H01L 2224/83385* (2013.01); *H01L 2224/85001* (2013.01); *H01L 2224/85444* (2013.01); *H01L 2224/85455* (2013.01); *H01L 2224/85464* (2013.01); *H01L 2224/92* (2013.01); *H01L 2224/92247* (2013.01); *H01L 2224/97* (2013.01); *H01L 2225/0651* (2013.01); *H01L 2225/06579* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01027* (2013.01); *H01L 2924/01029* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/3025* (2013.01)

(56) References Cited

U.S. PATENT DOCUMENTS

| Patent No. | Kind | Date | Inventor | Ref |
|---|---|---|---|---|
| 4,501,960 | A | 2/1985 | Jouvet et al. | |
| 4,801,561 | A | 1/1989 | Sankhagowit | |
| 4,855,672 | A | 8/1989 | Shreeve | |
| 5,247,248 | A | 9/1993 | Fukunaga | |
| 5,248,075 | A | 9/1993 | Young et al. | |
| 5,396,185 | A | 3/1995 | Honma et al. | |
| 5,397,921 | A | 3/1995 | Karnezos | |
| 5,479,105 | A | 12/1995 | Kim et al. | |
| 5,596,231 | A | 1/1997 | Combs | |
| 5,656,550 | A | 8/1997 | Tsuji et al. | |
| 5,764,485 | A | 6/1998 | Lebaschi | |
| 5,843,808 | A | 12/1998 | Karnezos | |
| 5,976,912 | A * | 11/1999 | Fukutomi et al. | 438/110 |
| 5,990,692 | A | 11/1999 | Jeong et al. | |
| 6,072,239 | A | 6/2000 | Yoneda et al. | |
| 6,111,324 | A | 8/2000 | Sheppard et al. | |
| 6,159,770 | A | 12/2000 | Tetaka et al. | |
| 6,166,430 | A * | 12/2000 | Yamaguchi | 257/666 |
| 6,229,200 | B1 | 5/2001 | Mclellan et al. | |
| 6,232,650 | B1 | 5/2001 | Fujisawa et al. | |
| 6,242,281 | B1 | 6/2001 | Mclellan et al. | |
| 6,284,569 | B1 | 9/2001 | Sheppard et al. | |
| 6,285,075 | B1 | 9/2001 | Combs et al. | |
| 6,294,100 | B1 | 9/2001 | Fan et al. | |
| 6,304,000 | B1 | 10/2001 | Isshiki et al. | |
| 6,324,754 | B1 | 12/2001 | DiStefano et al. | |
| 6,326,678 | B1 | 12/2001 | Karnezos et al. | |
| 6,329,605 | B1 | 12/2001 | Beroz et al. | |
| 6,329,711 | B1 | 12/2001 | Kawahara et al. | |
| 6,353,263 | B1 | 3/2002 | Dotta et al. | |
| 6,376,921 | B1 | 4/2002 | Yoneda et al. | |
| 6,392,427 | B1 | 5/2002 | Yang | |
| 6,414,385 | B1 | 7/2002 | Huang et al. | |
| 6,429,048 | B1 | 8/2002 | McLellan et al. | |
| 6,451,709 | B1 | 9/2002 | Hembree | |
| 6,452,255 | B1 | 9/2002 | Bayan et al. | |
| 6,455,348 | B1 * | 9/2002 | Yamaguchi | 438/106 |
| 6,472,608 | B2 | 10/2002 | Nakayama | |
| 6,489,218 | B1 | 12/2002 | Kim et al. | |
| 6,498,099 | B1 | 12/2002 | McLellan et al. | |
| 6,507,116 | B1 | 1/2003 | Caletka et al. | |
| 6,545,332 | B2 | 4/2003 | Huang | |
| 6,545,347 | B2 | 4/2003 | McClellan | |
| 6,552,417 | B2 | 4/2003 | Combs | |
| 6,552,423 | B2 | 4/2003 | Song et al. | |
| 6,566,740 | B2 | 5/2003 | Yasunaga et al. | |
| 6,573,121 | B2 | 6/2003 | Yoneda et al. | |
| 6,585,905 | B1 | 7/2003 | Fan et al. | |
| 6,586,834 | B1 | 7/2003 | Sze et al. | |
| 6,635,957 | B2 | 10/2003 | Kwan et al. | |
| 6,667,191 | B1 | 12/2003 | McLellan et al. | |
| 6,686,667 | B2 | 2/2004 | Chen et al. | |
| 6,703,696 | B2 * | 3/2004 | Ikenaga et al. | 257/678 |
| 6,724,071 | B2 | 4/2004 | Combs | |
| 6,734,044 | B1 | 5/2004 | Fan et al. | |
| 6,734,552 | B2 | 5/2004 | Combs et al. | |
| 6,737,755 | B1 | 5/2004 | McLellan et al. | |
| 6,762,503 | B2 | 7/2004 | Lee | |
| 6,764,880 | B2 | 7/2004 | Wu et al. | |
| 6,781,242 | B1 | 8/2004 | Fan et al. | |
| 6,800,948 | B1 | 10/2004 | Fan et al. | |
| 6,812,552 | B2 | 11/2004 | Islam et al. | |
| 6,818,472 | B1 | 11/2004 | Fan et al. | |
| 6,818,978 | B1 | 11/2004 | Fan | |
| 6,818,980 | B1 | 11/2004 | Pedron, Jr. | |
| 6,841,859 | B1 | 1/2005 | Thamby et al. | |
| 6,876,066 | B2 | 4/2005 | Fee et al. | |
| 6,897,428 | B2 | 5/2005 | Minamio et al. | |
| 6,933,176 | B1 | 8/2005 | Kirloskar et al. | |
| 6,933,594 | B2 | 8/2005 | McLellan et al. | |
| 6,940,154 | B2 | 9/2005 | Pedron et al. | |
| 6,946,324 | B1 | 9/2005 | McLellan et al. | |
| 6,964,918 | B1 | 11/2005 | Fan et al. | |
| 6,967,126 | B2 | 11/2005 | Lee et al. | |
| 6,979,594 | B1 | 12/2005 | Fan et al. | |
| 6,982,491 | B1 | 1/2006 | Fan et al. | |
| 6,984,785 | B1 | 1/2006 | Diao et al. | |
| 6,989,294 | B1 | 1/2006 | McLellan et al. | |
| 6,995,460 | B1 | 2/2006 | McLellan et al. | |
| 7,008,825 | B1 | 3/2006 | Bancod et al. | |
| 7,009,286 | B1 | 3/2006 | Kirloskar et al. | |
| 7,049,177 | B1 | 5/2006 | Fan et al. | |
| 7,060,535 | B1 * | 6/2006 | Sirinorakul et al. | 438/123 |
| 7,071,545 | B1 | 7/2006 | Patel et al. | |
| 7,091,581 | B1 | 8/2006 | McLellan et al. | |
| 7,095,096 | B1 | 8/2006 | Mostafazadeh | |
| 7,101,210 | B2 | 9/2006 | Lin et al. | |
| 7,102,210 | B2 | 9/2006 | Ichikawa | |
| 7,166,919 | B2 | 1/2007 | Tabira | |
| 7,205,178 | B2 * | 4/2007 | Shiu et al. | 438/110 |
| 7,224,048 | B1 | 5/2007 | McLellan et al. | |
| 7,247,526 | B1 | 7/2007 | Fan et al. | |
| 7,274,088 | B2 | 9/2007 | Wu et al. | |
| 7,314,820 | B2 * | 1/2008 | Lin et al. | 438/617 |
| 7,315,080 | B1 | 1/2008 | Fan et al. | |
| 7,342,305 | B1 | 3/2008 | Diao et al. | |
| 7,344,920 | B1 | 3/2008 | Kirloskar et al. | |
| 7,348,663 | B1 | 3/2008 | Kirloskar et al. | |
| 7,358,119 | B2 | 4/2008 | McLellan et al. | |
| 7,371,610 | B1 | 5/2008 | Fan et al. | |
| 7,372,151 | B1 | 5/2008 | Fan et al. | |
| 7,381,588 | B1 | 6/2008 | Patel et al. | |
| 7,399,658 | B2 | 7/2008 | Shim et al. | |
| 7,408,251 | B2 | 8/2008 | Hata et al. | |
| 7,410,834 | B2 | 8/2008 | Fukaya et al. | |
| 7,411,289 | B1 | 8/2008 | McLellan et al. | |
| 7,449,771 | B1 | 11/2008 | Fan et al. | |
| 7,482,690 | B1 | 1/2009 | Fan et al. | |
| 7,595,225 | B1 | 9/2009 | Fan et al. | |
| 7,608,482 | B1 | 10/2009 | Bayan et al. | |
| 7,655,506 | B2 | 2/2010 | Tabira | |
| 7,714,418 | B2 | 5/2010 | Lim et al. | |
| 7,790,500 | B2 | 9/2010 | Ramos et al. | |
| 2001/0008305 | A1 | 7/2001 | McLellan et al. | |
| 2002/0027297 | A1 * | 3/2002 | Ikenaga et al. | 257/784 |
| 2002/0041019 | A1 * | 4/2002 | Gang | 257/678 |
| 2002/0074672 | A1 * | 6/2002 | Huang et al. | 257/788 |
| 2002/0160552 | A1 * | 10/2002 | Minamio et al. | 438/108 |
| 2003/0006055 | A1 | 1/2003 | Chien-Hung et al. | |

(56) References Cited

U.S. PATENT DOCUMENTS

| | | |
|---|---|---|
| 2003/0045032 A1 | 3/2003 | Abe |
| 2003/0071333 A1 | 4/2003 | Matsuzawa |
| 2003/0102537 A1* | 6/2003 | McLellan et al. ............. 257/666 |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2004/0004292 A1 | 1/2004 | Hsieh et al. |
| 2004/0014257 A1 | 1/2004 | Kim et al. |
| 2004/0046237 A1 | 3/2004 | Abe et al. |
| 2004/0046241 A1 | 3/2004 | Combs et al. |
| 2004/0080025 A1 | 4/2004 | Kasahara et al. |
| 2004/0110319 A1* | 6/2004 | Fukutomi et al. ............. 438/106 |
| 2005/0003586 A1 | 1/2005 | Shimanuki et al. |
| 2005/0017335 A1 | 1/2005 | Tabira |
| 2005/0046023 A1 | 3/2005 | Takahashi et al. |
| 2005/0077613 A1 | 4/2005 | McLellan et al. |
| 2006/0121719 A1* | 6/2006 | Nakamura et al. ............. 438/613 |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0273433 A1 | 12/2006 | Itou et al. |
| 2007/0001278 A1 | 1/2007 | Jeon et al. |
| 2007/0090495 A1* | 4/2007 | Kim et al. ............. 257/666 |
| 2007/0200210 A1 | 8/2007 | Zhao et al. |
| 2007/0235217 A1 | 10/2007 | Workman |
| 2008/0048308 A1 | 2/2008 | Lam |
| 2008/0096046 A1 | 4/2008 | Yamashita et al. |
| 2008/0150094 A1 | 6/2008 | Anderson |
| 2008/0258278 A1 | 10/2008 | Ramos et al. |
| 2010/0224971 A1 | 9/2010 | Li |
| 2011/0147931 A1 | 6/2011 | Nondhasitthichai et al. |
| 2011/0169151 A1 | 7/2011 | Camacho et al. |
| 2012/0018866 A1 | 1/2012 | Camacho et al. |
| 2012/0068318 A1 | 3/2012 | Camacho et al. |
| 2012/0280377 A1 | 11/2012 | Do et al. |

OTHER PUBLICATIONS

U.S. Appl. No. 11/731,522, Saravuth Sirinorakul et al.
U.S. Appl. No. 11/899,189, Saravuth Sirinorakul et al.
U.S. Appl. No. 12/002,054, Somchai Nondhasitthichai et al.
U.S. Appl. No. 12/002,186, Somchai Nondhasitthichai et al.
U.S. Appl. No. 12/002,187, Somchai Nondhasitthichai et al.
U.S. Appl. No. 12/154,483, Saravuth Sirinorakul et al.
U.S. Appl. No. 12/231,710, Saravuth Sirinorakul et al.
U.S. Appl. No. 12/287,174, Saravuth Sirinorakul et al.
U.S. Appl. No. 12/378,119, Somchai Nondhasitthichai et al.
Office Action dated Nov. 9, 2010, U.S. Appl. No. 11/731,522, filed Mar. 30, 2007, Somchai Nondhasitthichai et al.
Office Action dated Mar. 29, 2010, U.S. Appl. No. 11/731,522, filed Mar. 30, 2007, Somchai Nondhasitthichai et al.
Non-Final Office Action dated Jul. 8, 2011, U.S. Appl. No. 11/731,522, filed Mar. 30, 2007, Somchai Nondhasitthichai et al.
Publication No. US 2011/0198752 A1, dated Aug. 18, 2011, U.S. Appl. No. 13/080,512, filed Apr. 5, 2011, Somchai Nondhasitthichai.
Office Action mailed Jun. 19, 2013, U.S. Appl. No. 13/603,311, filed Sep. 4, 2012, Somchai Nondhasitthichai et al.
Office Action mailed Mar. 15, 2013, U.S. Appl. No. 13/040,112, filed Mar. 3, 2011, Somchai Nondhasitthichai.
Office Action mailed Mar. 21, 2013, U.S. Appl. No. 13/080,512, filed Apr. 5, 2011, Somchai Nondhasitthichai.
Notice of Allowance mailed on Oct. 7, 2013, U.S. Appl. No. 13/603,311, filed Sep. 4, 2012, Somchai Nondhasitthichai et al.
Notice of Allowance mailed on Oct. 11, 2013, U.S. Appl. No. 13/904,931, filed May 29, 2013, Somchai Nondhasitthichai et al.
Office Action mailed Aug. 1, 2013, U.S. Appl. No. 13/904,931, filed May 29, 2013, Somchai Nondhasitthichai et al.

* cited by examiner

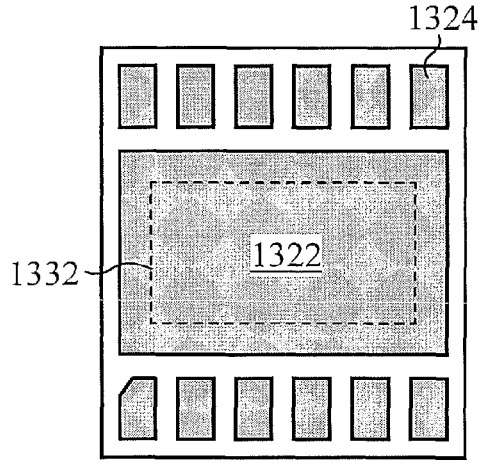
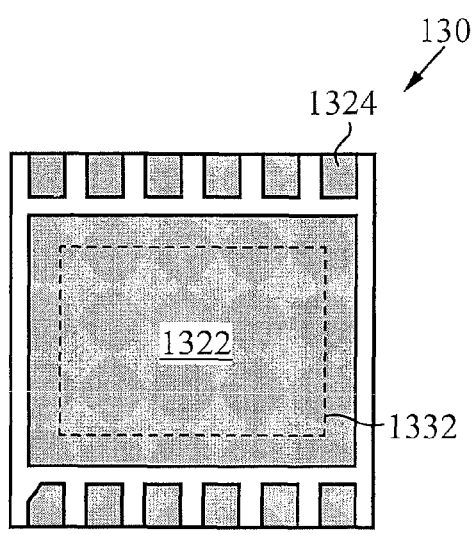
Fig. 13        Fig. 13A
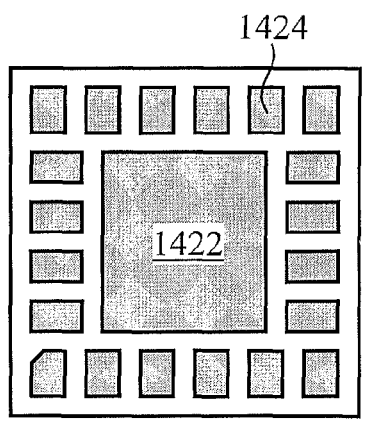
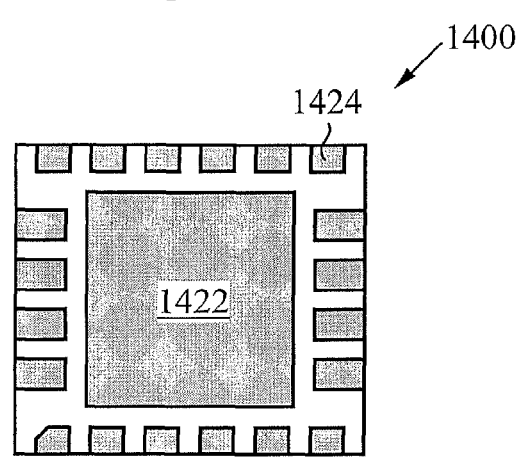
Fig. 14        Fig. 14A
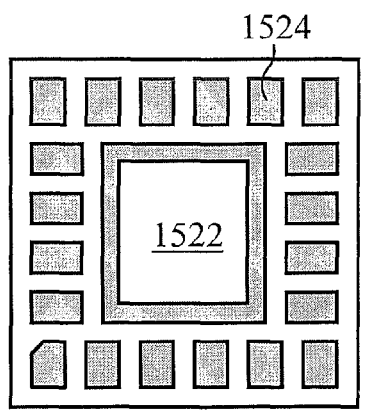
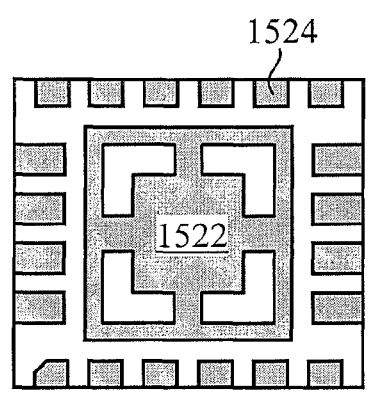
Fig. 15        Fig. 15A

METHOD FOR FORMING LEAD FRAME LAND GRID ARRAY

CROSS REFERENCE TO RELATED APPLICATIONS

This application is a Divisional Application of the application Ser. No. 11/731,522 filed Mar. 30, 2007 now U.S. Pat. No. 8,310,060 and titled "LEAD FRAME LAND GRID ARRAY," hereby incorporated in its entirety.

RELATED APPLICATIONS

This application claims benefit of priority under 35 U.S.C. section 119(e) of co-pending U.S. Provisional Patent Application 60/795,929 filed Apr. 28, 2006, which is incorporated herein by reference.

FIELD OF THE INVENTION

The present invention is related to the field of semiconductor packaging. More specifically, the present invention is directed to lead frame land grid array (LLGA).

BACKGROUND

The art of surface mount technologies for some semiconductor packages, is developing at a rapid pace. For instance, the following set of continuation-in-part and divisional patents describes one such developing lineage. In particular, U.S. Pat. No. 6,072,239 to Yoneda, et al., entitled "Device Having. Resin Package with Projection" (Yoneda '239) claims, among other things, a device having a chip, a resin package sealing the chip, metallic films, and connecting parts. The resin package has resin projections that are located on a mount-side surface of the resin package. The resin projections have surfaces that are parallel to the mount-side surface of the resin package. The metallic films are formed on the entire surfaces of the resin projections.

U.S. Pat. No. 6,159,770 to Tetaka, et al., entitled "Method and Apparatus for Fabricating Semiconductor Device," (Tetaka '770) claims a method of fabricating the semiconductor device of Yoneda '239. Tetaka '770 is a continuation-in-part of Yoneda '239.

U.S. Pat. No. 6,329,711 to Kawahara, et al., entitled "Semiconductor Device and Mounting Structure," (Kawahara '711) claims a semiconductor device that has a semiconductor element, a resin package sealing the semiconductor element, resin projections, metallic film parts, connecting members, and connection pads. Each of the metallic film parts has a single point that makes contact with a circuit board. Kawahara '711 is a continuation-in-part of Yoneda '239.

U.S. Pat. No. 6,376,921 to Yoneda, et al., entitled "Semiconductor Device, Method for Fabricating the Semiconductor device, Leadframe and Method for Producing the Leadframe" (Yoneda '921) claims a semiconductor device that has a semiconductor element, a resin package sealing the semiconductor element, resin projections, metallic film portions, and connecting members. The resin projections protrude downward from a mounting surface of the resin package. Yoneda '921 is a continuation-in-part of Yoneda '239.

U.S. Pat. No. 6,573,121 to Yoneda, et al., entitled "Semiconductor Device, Method for Fabricating the Semiconductor Device, Leadframe and Method for Producing the Leadframe," (Yoneda '121) claims a method of producing a lead frame used to fabricate the semiconductor device of Yoneda '921. Yoneda '121 is a division of Yoneda '921.

However, this patent family lineage describes fabricating semiconductors by using numerous processing steps. Moreover, the packages produced by the patents mentioned above have certain limitations in the art.

SUMMARY OF THE DISCLOSURE

A package includes a first plated area, a second plated area, a die attached to the first plated area, and a bond coupling the die to the second plated area. The package further includes a molding encapsulating the die, the bond, and the top surfaces of the first and second plated areas, such that the bottom surfaces of the first and second plated areas are exposed exterior to the package. The first plated area is typically used to form a die attach pad or, alternatively, the first plated area is used for a contact pad. The package is preferably disposed within a molded block of packages. The molded block is formed by using a metal layer and removing the metal layer from the molded block, such that the plated areas are exposed. For instance, the metal layer is removed by etching. Advantageously, the molded block provides a reliable structure for handling the package. Moreover, the molded block also provides for a high speed bulk processing of a quantity of packages such as, for example, by using parallel processing, and/or simultaneous processing of the block of packages.

In some cases, the second plated area is not exposed at a side surface of the package, while in alternative implementations, the second plated area is exposed at a side surface of the package. Some embodiments include a third plated area that extends at least partially around the first plated area. For instance, when the first plated area forms a die pad, the third plated area includes a band near a perimeter of the die pad. The third plated area in some of these cases forms a ring surrounding the die pad.

The die of some embodiments has a width dimension greater than a dimension of the first plated area, such that the die overhangs the first plated area. In a particular case, the first plated area forms a first contact pad, and the second plated area forms a second contact pad, and the die is coupled to the first and second contact pads without the need for a die pad, such that space required by the package is conserved. Also in particular instances, the size of the package closely approximates the size of the die.

The bond of some embodiments is a bonding wire for coupling the die to the second plated area. Alternatively, the bond is a solder ball. In these cases, an active circuit of the semiconductor die is either on a top surface of the die, or on a bottom surface. Some implementations have contact pads configured in various patterns. For instance, the contact pads of some of these embodiments form a row of contact pads near a perimeter of a die pad. In these various patterns, the contact pads are alternatively exposed at a side surface of the package, or not exposed at a side surface of the package. Moreover, the contact pads of some embodiments are arranged into multiple rows at a perimeter of a die pad, such as in staggered rows, for example. Further, the contact pads in a particular arrangement surround a die pad, in a ring pattern, or another pattern. Some embodiments further include a guard band and/or a guard ring, along with the die pad and/or contact pads at the bottom surface of the package.

Additionally, a package includes a first plated area, a second plated area, a first die attached to the first plated area, a second die coupled to the first die, and a first bond coupling the first die to the second plated area. The package also includes a molding encapsulating the first die, the second die, the bond, and the top surfaces of the first and second plated areas, such that the bottom surfaces of the first and second plated areas are exposed exterior to the package. In some of these cases, the first die and the second die are stacked, and the first bond includes a solder ball. Preferably, these packages include a wire bond for coupling the second die to one of the first and second plated areas. The die is of various sizes. For instance, the first die is larger than the second die, or alternatively, the first die is smaller than the second die.

A method of packaging forms a metal layer, plates a first area of the metal layer, and plates a second area of the metal layer. The method attaches a die to the first area of the metal layer and bonds a wire. The wire couples the die to one of the plated areas. The method applies a molding such that the surfaces exposed above the metal layer are encapsulated in a molded block. The method removes the metal layer from the molded block, such that the plated areas are exposed. The first plated area typically includes a die attach pad, or alternatively includes a contact pad.

Removing the metal layer preferably involves etching away the metal layer, without removing the plated regions such that the plated regions are exposed at an exterior surface of the package. The method of some embodiments also tests the molded block. Testing the molded block in some cases is a parallel process for several devices within the molded block. Some embodiments also singulate a molded package from the molded block. In a particular case, the second plated area has a minimum thickness of about 6.0 micro meters. In some of these embodiments, the plating has multiple layers that preferably include palladium, nickel, and gold. For instance, in particular instances, a first layer of palladium has a minimum thickness of 0.5 micro meters, a layer of nickel has a minimum thickness of 5.0 micro meters, a second layer of palladium has a minimum thickness of 0.1 micro meters, and/or a layer of gold has a thickness of about 50 Angstroms. In some implementations the method exposes the second plated area at a side surface of the package. Typically, the second plated area is for forming a contact pad that is accessible at the side surface. Alternatively, the method encapsulates the second plated area at a side surface of the package.

BRIEF DESCRIPTION OF THE DRAWINGS

The novel features of the invention are set forth in the appended claims. However, for purpose of explanation, several embodiments of the invention are set forth in the following figures.

FIG. 4 illustrates a package having contact pads that are not at the edge of the package.

FIG. 5 illustrates a package having a die that is larger than its die attach pad.

FIG. 6 illustrates a die overhanging its die attach pad.

FIG. 7 illustrates a die having a size that is close to the size of a package.

FIG. 8 illustrates solder balls are optionally used to couple the die to the contact pads.

FIG. 9 illustrates a package that is a hybrid of flip chip and wire bonding methods.

FIGS. 10-12 illustrate a stacked die implementation.

In particular, FIG. 10 illustrates stacked die where one die is smaller than another die.

FIG. 11 illustrates stacked die that are approximately the same size with a spacer die.

FIG. 12 illustrates stacked die that are approximately the same size with epoxy instead of a spacer die.

FIGS. 13-17 illustrate various bottom view configurations for multiple embodiments of the invention.

In particular, FIG. 13 illustrates contact pads at the sides of a die pad, according to some embodiments.

FIG. 13A illustrates the package of FIG. 13 with the contact pads at the edge of the package.

FIG. 14 illustrates contact pads surrounding the periphery of the die pad.

FIG. 14A illustrates the package of FIG. 14 with the contact pads at the edge of the package.

FIG. 15 illustrates a die pad having an exposed center.

FIG. 15A illustrates an alternative configuration for the die pad and with contact pads at the edge of the package.

FIG. 16 illustrates multiple rows of contact pads surrounding the periphery of the die pad.

FIG. 17 illustrates a guard band according to some embodiments.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

I. Method

Figure 1:
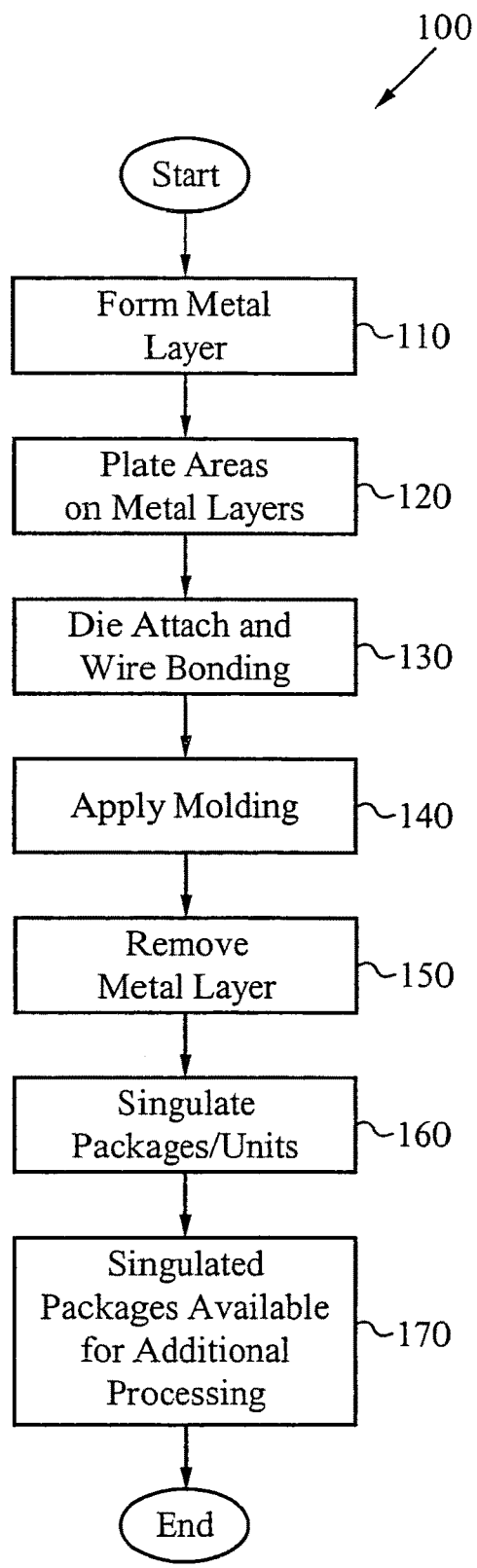
FIG. 1 illustrates a process according to some embodiments of the invention.
Figure 1A:
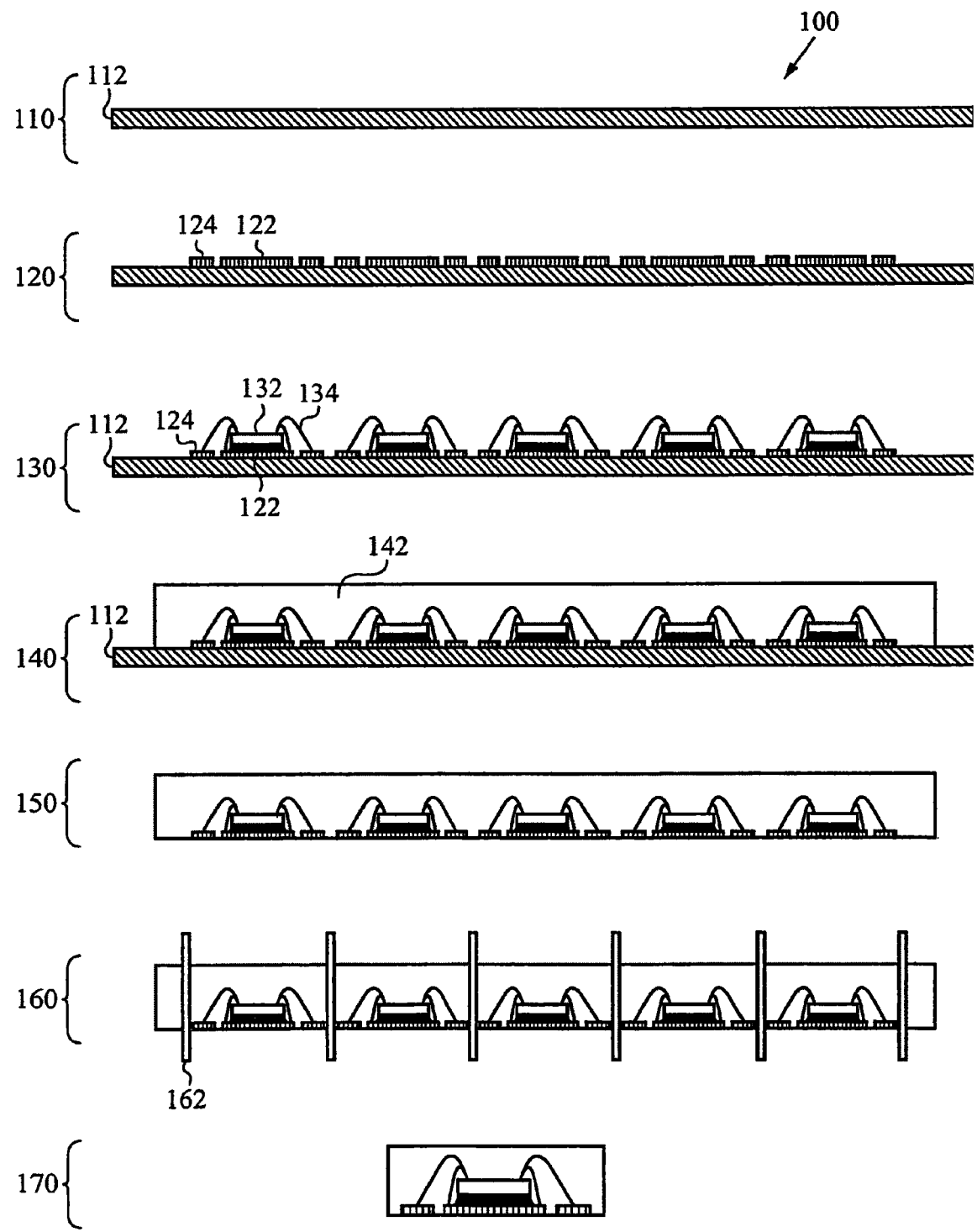
FIG. 1A illustrates an exemplary result for each step in the process of FIG. 1.

FIG. 1 illustrates a process 100 for manufacturing a semiconductor package according to some embodiments of the invention. FIG. 1A illustrates an exemplary result for each step in the process 100 of FIG. 1. As shown in these figures, the process 100 begins at the step 110, where a metal layer 112 is formed. The metal layer typically comprises copper, Alloy 42, or another suitable metal material, and has a typical thickness of about 0.1 to 0.15 millimeters. Then, after the step 110, the process 100 transitions to the step 120, where particular areas on the metal layer 112 are plated. These areas typically include an area for a die pad 122 and a contact pad 124.

Once the particular areas on the metal layer 112 are plated, the process 100 transitions to the step 130, where die attach and/or wire bonding occur. As shown in FIG. 1A, die attach typically includes coupling a die 132 to the die attach pad 122, while wire bonding includes using a wire 134 to couple the die 132 to the die pad 122 and/or one or more contact pads 124.

After die attach and/or wire bonding occur at the step 130, the process 100 transitions to the step 140, where a molding 142 is applied. Typically the molding 142 includes a plastic polymer or resin that encapsulates the die 132, the wire bonds 134, the top surface of the metal layer 112, and the top surface of the plated areas, including the die pad 122 and the contact pads 124.

Once the molding 142 is applied at the step 140, the process 100 transitions to the step 150, where the metal layer 112 is removed. Some embodiments employ a chemical etchant to etch away the metal layer 112 without affecting the plated areas (122 and 124) or the molding 142. In these embodiments, when the metal layer 112 is etched away, the bottom surfaces of the plated areas, including the die pad 122, and the contact pads 124, are typically exposed.

At this point, some embodiments have formed a molded block 300 (see FIG. 3) having exposed plated contact areas. Such a configuration has particular advantages in the industry. For instance, the molded block 300 is advantageously employed for testing and other processes after the step 150 of FIG. 1. The testing of some embodiments comprises a parallel, high speed, and/or bulk process for several of the devices located within the molded block 300. The molded block 300 of these embodiments is further described below in relation to FIG. 3.

Figure 2:
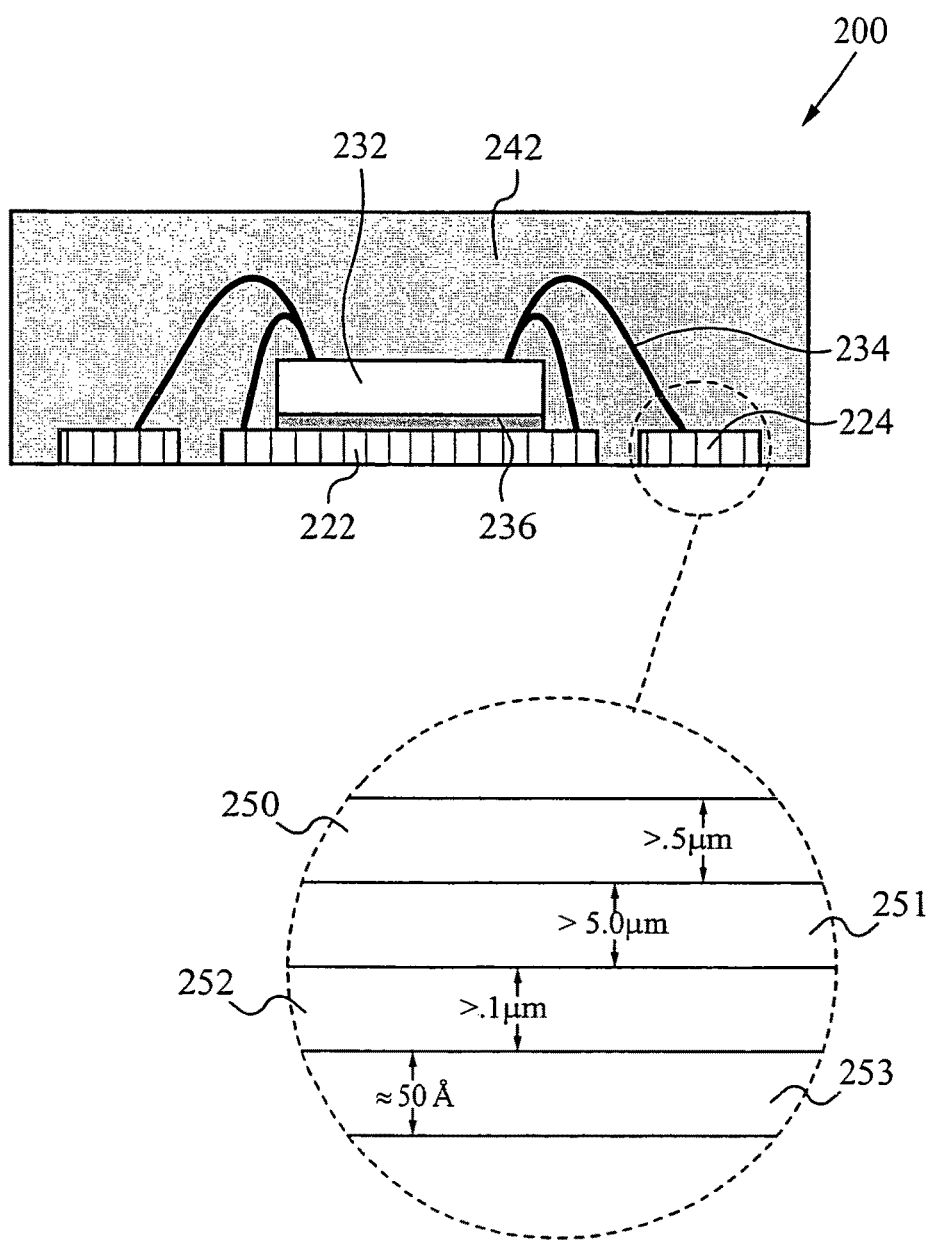
FIG. 2 illustrates an exemplary product of the method of some embodiments in further detail.

Regardless of any testing and/or additional process steps after the step 150 of FIG. 1, the process 100 typically transitions to the step 160, where individual units contained within the molded block 300 are singulated to form individual semiconductor packages (see FIG. 2). Then, the process 100 transitions to the step 170, where the singulated packages are available for additional testing, processing, shipping and/or use. However, testing, handling, and/or processing of individual singulated packages at the step 170, rather than by using the molded block 300 (available after the step 150), presents certain disadvantages, as discussed below. After the step 170, the process 100 concludes.

FIG. 2 illustrates an exemplary package 200 of the method of some embodiments in further detail. As shown in this figure, the exemplary package 200 has an exposed die attach pad 222, one or more contact pads 224, a semiconductor die 232, one or more wire bonds 234, an adhesive 236, and a molding compound 242. The adhesive 236 preferably couples the die 232 to the die attach pad 222. The wire bonds 234 typically couple the die 232 to one or more contact pads 224 and/or the die attach pad 222.

Also shown in FIG. 2, the plating of some embodiments comprises multiple layers. For instance, the plating layers of some embodiments include palladium, nickel, and/or gold. In a particular embodiment, a first layer of palladium 250 has a minimum thickness of 0.5 micro meters, a layer of nickel 251 has a minimum thickness of 5.0 micro meters, a second layer of palladium 252 has a minimum thickness of 0.1 micro meters, and a layer of gold 253 has a thickness of about 50 Angstroms. In some of these particular embodiments, the first layer of palladium is located near an interior of the package for providing a coupling locus to the wire bond 234 while the sold plating is preferably located near, or is exposed near the bottom surface of the package 200, for providing a contact locus to a printed circuit board, or the like. The plated area (the die pad and contact pads) of these embodiments typically has a total thickness in the range of about 6.0 micro meters to 12.0 micro meters. As mentioned above, the plated area(s) and the molding are minimally or not affected by the removal of the metal layer at the step 150 of FIG. 1. For instance, when the metal layer comprises copper, and the removal step 150 involves using a chemical etchant, preferably, the etchant and/or the plating structure are selected such that the etchant is reactive (removes) the metal layer with minimal effect to the plating. An example of such an etchant includes cupric chloride.

Figure 3:
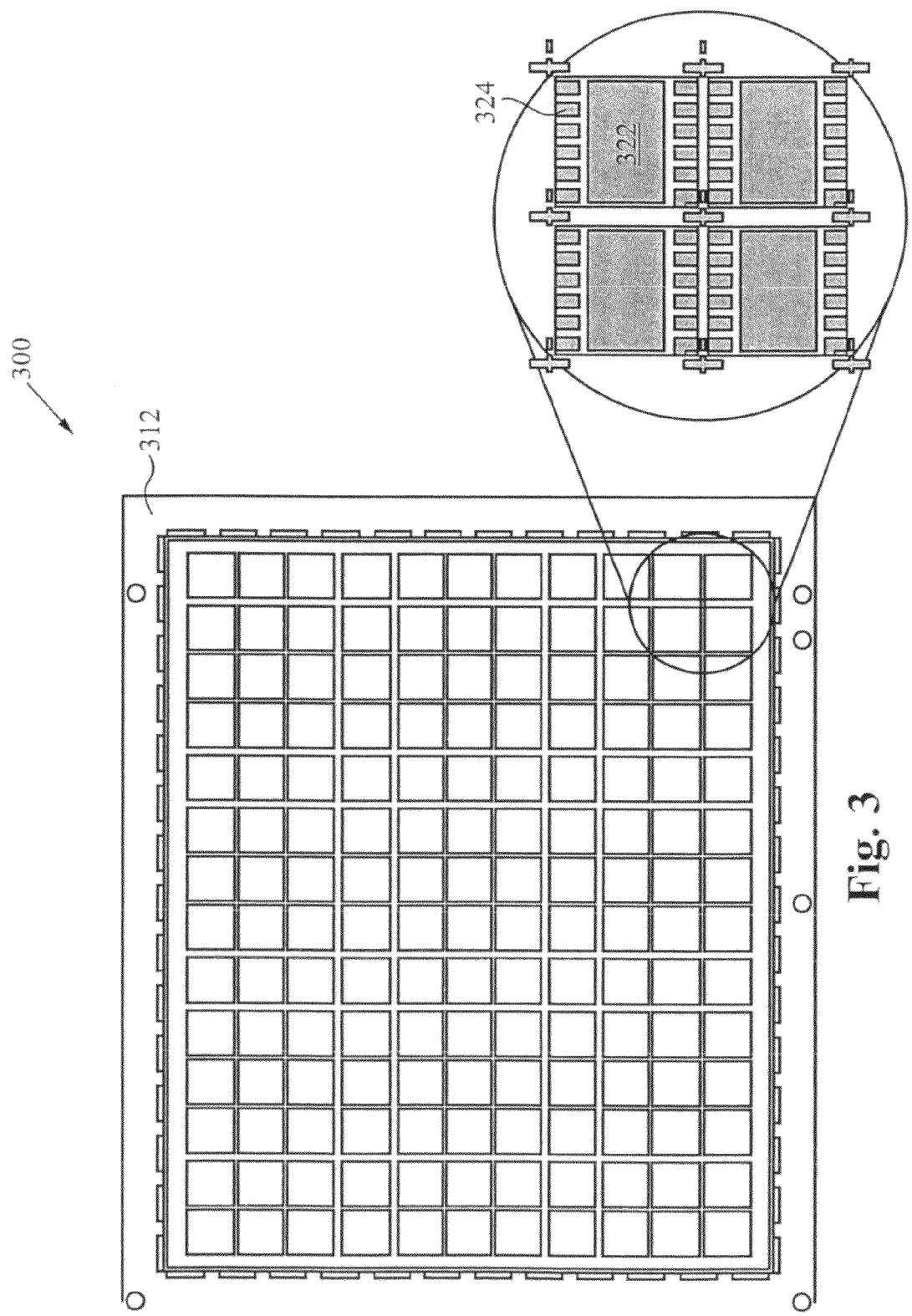
FIG. 3 illustrates a molded block in accordance with some embodiments.

Also mentioned above, the molded blocks produced during the process 100 have certain advantages for handling and additional processing, over the individual singulated packages illustrated in FIG. 2. FIG. 3 illustrates a molded block 300 in accordance with some embodiments. As shown in this figure, the molded block 300 includes plated areas (that typically include die pads 322 and/or contact pads 324) for attaching potentially many semiconductor devices. Also shown in FIG. 3, the molded block 300 has an attached metal layer 312 that was used for the plating and molding (encapsulation) steps to generate the molded block 300. As mentioned above, the metal layer 312 is preferably etched away to expose the plated areas of the molded block 300.

The molded block 300 of these embodiments has certain advantages, particularly for the manipulation and testing of semiconductor devices. For instance, the molded block of a particular embodiment has dimensions of approximately 1.77×2.0 inches, and includes approximately 250 to 2,500 semiconductor units. This molded block, due to its molding strength and particular size, is configured for parallel processing of substantially all of the semiconductor devices within the molded block, simultaneously. Conventionally, semiconductor device and/or package processing includes time consuming operations, such as test, for example. However, parallel processing of such operations advantageously enhances the speed and reliability of performing such operations, for bulk quantities.

II. Streamlined Process and Configuration Advantages

The process 100 described above, further includes additional advantages. For instance, due to the direct use of the metal layer and plated areas, and the subsequent removal of the metal layer to expose the plated areas, embodiments of the invention reduce the number of process steps required for semiconductor package formation. This presents cost savings, and time savings, which present additional cost savings, over conventional methods. These and other advantages are discussed in further detail below, in relation to the referenced figures.

FIGS. 4-17 illustrate various side and/or bottom view configurations for multiple embodiments of the invention. Some of these embodiments are formed by using the process 100 described above in relation to FIGS. 1 and 1A. As illustrated in FIGS. 4-17, these packages have several advantages.

(1) For instance, as mentioned above, the process 100 has fewer steps of fabrication than conventional methods known in the art. Because the process 100 has fewer steps, it is less expensive than the processes known in the art. Moreover, because the process 100 has fewer steps, it is also generally faster than other processes, or, in other words, has a higher throughput.

(2) The process 100 is capable of yielding package sizes that are close to the dimension of the packaged die inside the package. The advantages of reductions in package size are understood by those of ordinary skill. For example, a package having a footprint that is approximately its die size will require a mounting area on a circuit board that is not much greater than approximately the size of the die. Thus, this advantage allows the placement of many more semiconductor devices on a board, or the use of a smaller circuit board, which further typically results in smaller form factor applications, and additional size and/or cost savings, such as from reduced shipping and manufacturing costs, for example.

(3) Further, a package having a thickness close to the die thickness encapsulated inside the package allows for lower profile implementations that use such small outline and/or low profile packages.

(4) Because the critical factor regarding height for the packages formed by the process 100, is typically the height of the die, or another factor, the height of the contact pads has no or negligible impact on the height of the package. Effectively, the contact pads have a zero, or almost zero, height in relation to the height of the package and/or the die.

(5) Additionally, because the process 100 has fewer steps, and its products are typically close in size to the small encapsulated die, the packages illustrated and described herein provide savings in the volume of construction materials consumed over time, or, in other words, provide a higher yield. Moreover, the various many possible package configurations enabled by the process 100 described above, yield further advantages, as discussed below.

III. Side ("Cross Section") Views of Exemplary Package Designs

Figure 4:
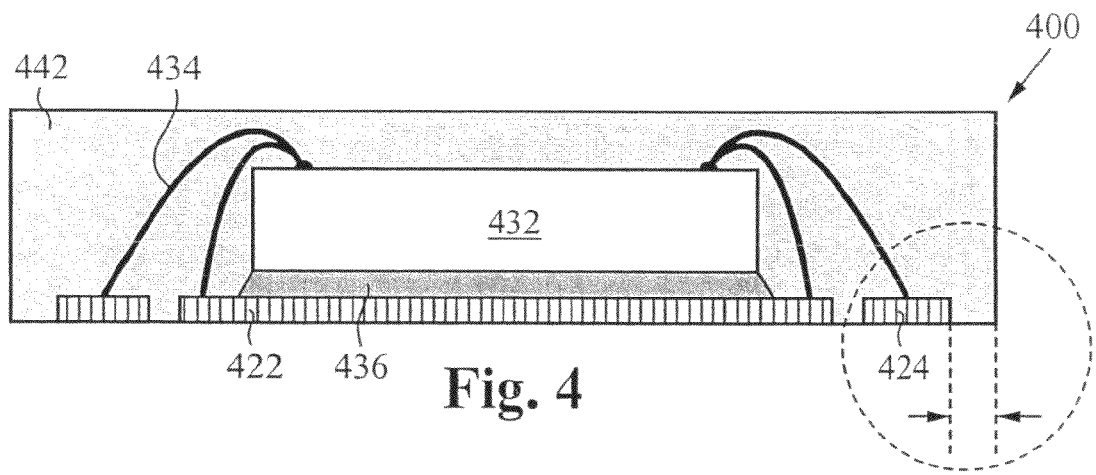
FIGS. 4-12 illustrate cross section views taken on a side of a package in accordance with some embodiments.
Figure 4A:
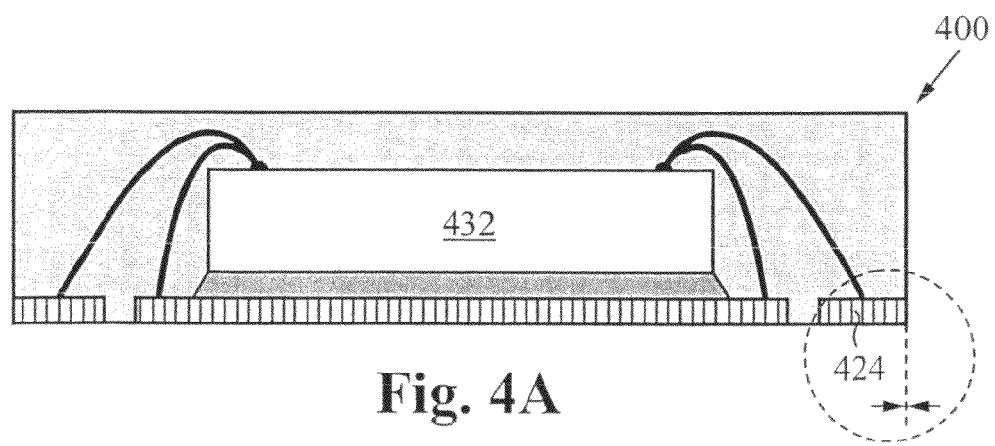
FIG. 4A illustrates a package having contact pads that are at the edge of the package.

FIGS. 4-12 illustrate a cross section (side view) of the package of some embodiments. For instance, FIG. 4 illustrates a package 400 having contact pads 424 that are not at the edge of the package 400, while FIG. 4A illustrates a package having contact pads 424 that are at the edge of the package 400. Some embodiments alternatively select whether the contact pads 424 should be placed at the edge of the package 400. Some embodiments of the process 100 illustrated in FIGS. 1 and 1A above, account for the position of the contact pads 424 at the step 120 (plating) and/or the step 150 (singulation). As an example, some embodiments plate areas for the contact pads of two adjacent packages close together during the plating step 120 of FIG. 1. Then, during the singulation step 150 of FIG. 1, these embodiments singulate or remove the entire molding and unplated regions between the two contact pads, such that the resultant two separate packages to the left and right of the singulation cut have contact pads that are at the edge of the package. These packages are typically smaller in size and have a slightly smaller footprint due to the maximum use of the edge of the package for the contact pad. Hence, and as additionally shown in FIGS. 4 and 4A, the decision whether the contact pads 424 are placed at edge of the package 400, or not, affects the overall footprint and space available within and at the bottom footprint of the package 400.

Figure 5:
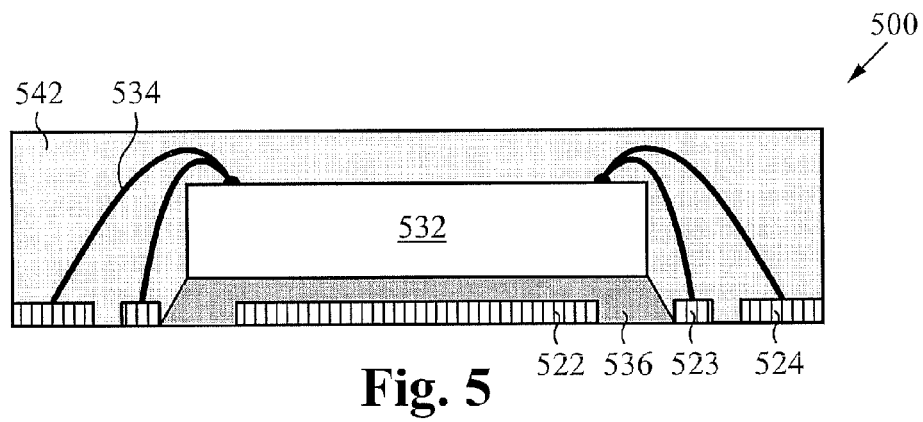
Figure 5A:
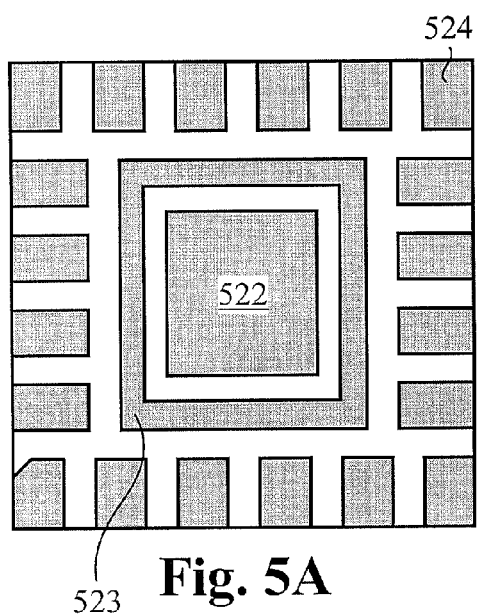
FIG. 5A illustrates a bottom view for the package of FIG. 5 having a ring around the die attach pad.
Figure 5B:
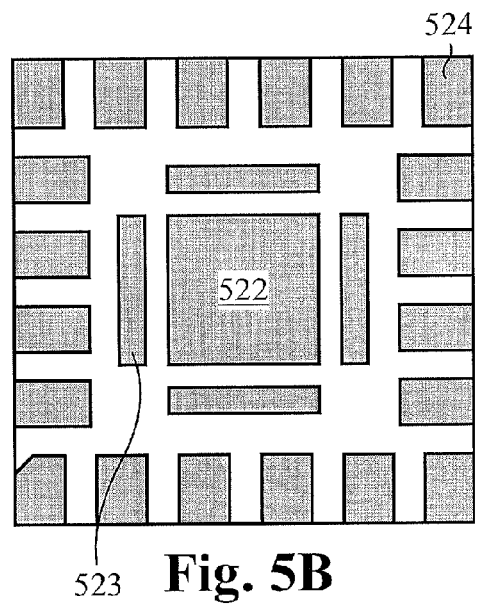
FIG. 5B illustrates an alternate bottom view for the package of FIG. 5, which has a discontinuous ring around the die attach pad.

Some embodiments have various additional configurations for the contact pads and the die pad that vary, in some aspects, in relation to the die. For instance, FIG. 5 illustrates a package 500 having a die 532 that is larger than its die attach pad 522. As shown in this figure, the die 532 of some of these configurations overhangs the die pad 522. In these configurations, an adhesive 536 tropically used to secure the die 532 to the die pad 522, often spans the surface of the die pad 522 and spills over to engulf the surfaces of the die pad 522 that are not shielded by the metal layer during the encapsulation step (140 of FIG. 1). Due to the additional space between the die pad 522 and the edge-located contact pads 524, some of these configurations further include an additional plated ring around the die pad 522. Some of these rings are continuous, while some are discontinuous around the die pad 522. FIG. 5A illustrates a bottom view for the package 500 of FIG. 5 having a ring 523 around the die pad 522. FIG. 5B illustrates an alternate bottom view for the package 500 of FIG. 5, which has a discontinuous ring 523 around the die attach pad 522.

These plated areas 523 between the die pad 522 and the contact pads 524 provide additional plated areas for electrical contact and/or heat transfer for the package 500. Some embodiments, for instance, couple the die to the plated ring, particularly where the die overhangs the die pad, while some embodiments forego the die pad altogether in favor of the plated ring of these embodiments. More specifically, the purpose of the plated ring of particular embodiments is that some die designs, such as the "ground bond" design, require a connection between a top surface of the die and a ground of the printed circuit board. In these embodiments, the plated ring 523 provides the grounding point for the printed circuit board. Some designs require a connection between a top surface of the die and both the plated ring area 523 and a contact pad 524. These designs, often referred to as "down bond" designs, typically include a wire bond between the plated ring 523, and the contact pad 524 (not shown).

Figure 6:
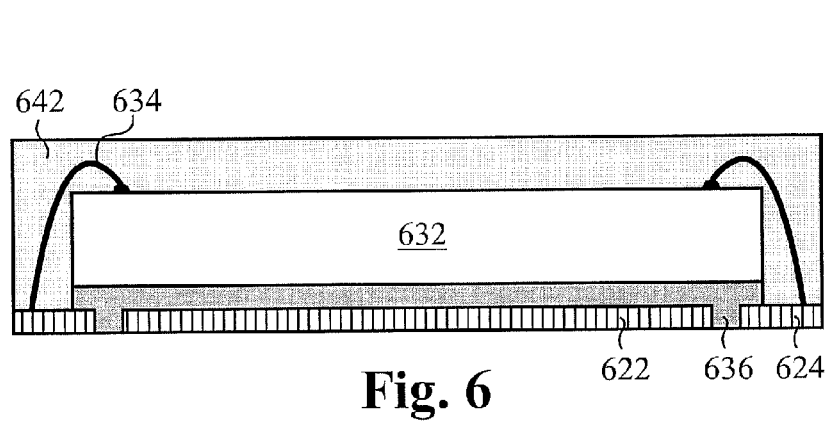

In additional embodiments, when the die overhangs the die pad, the die is attached to the die pad and is also advantageously attached to a portion of one or more contact pads. FIG. 6 illustrates such an embodiment where a die 632 that overhangs its die pad 622 is further attached to one or more contact pads 624. As shown in this figure, an adhesive 636 attaches the die 632 to both the die pad 622 and to the portions of the contact pads 624 that underlie the overhanging sides of the die 632.

Figure 7:
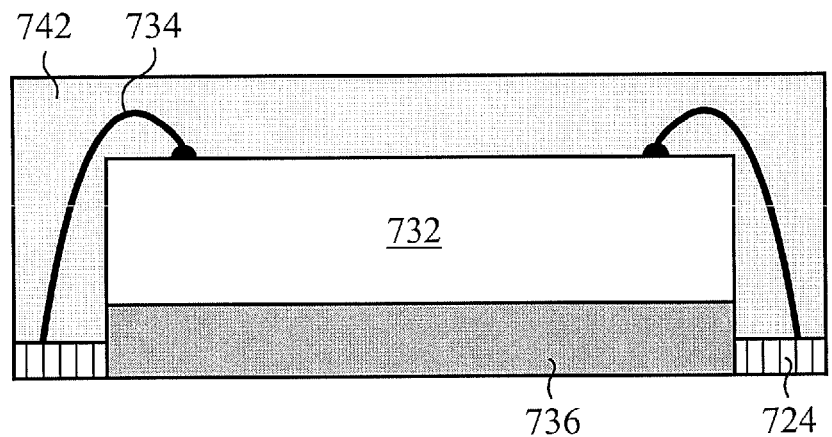

In some of the embodiments described above, or in other embodiments, the dimensions of the die approaches the size of the package. In other words, for very small packages, or for large die in relation to the size of the package, it is advantageous to optionally omit the die pad altogether. FIG. 7 illustrates such a package 700 that includes a die 732 having a size that is close to the size of the package 700. As shown in this figure, the die pad is omitted, such as during the plating step 120 of FIGS. 1 and 1A, above. In these embodiments, the omission of the die pad advantageously contributes to a reduction in form factor for the package 700.

Figure 7A:
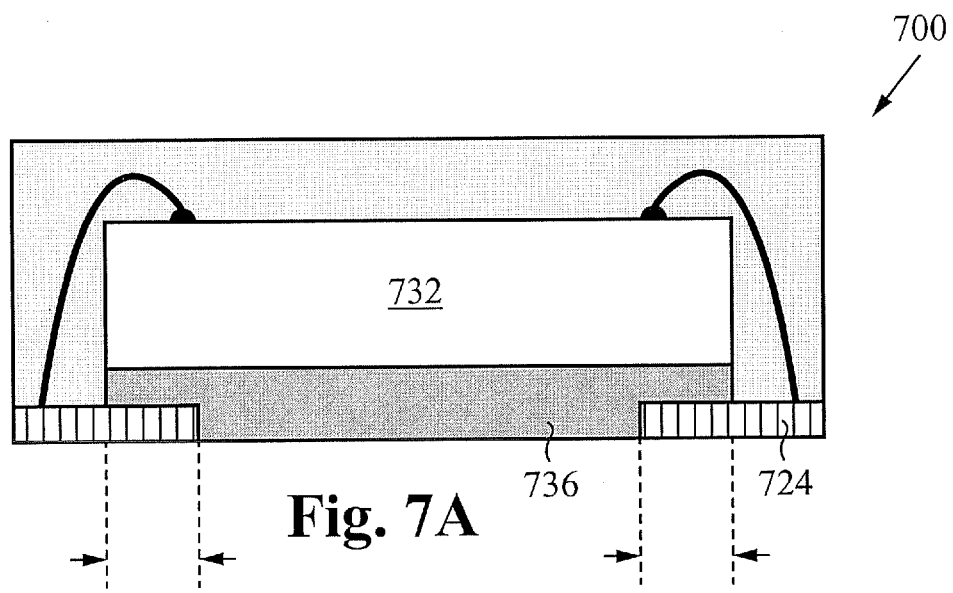
FIG. 7A illustrates a die similar in size to its package such that the die overhangs its die pad and the overhanging portion is bonded to the contact pads.

However, in some embodiments, it is often still desirable to provide external contact to the die pad, such as for electrical contact and/or heat dissipation, for example. FIG. 7A illustrates a die 732 having a similar size to a package 700, where the die 732 extends over the contact pads 724 and is bonded to the contact pads 724 by the adhesive 736.

Figure 8:
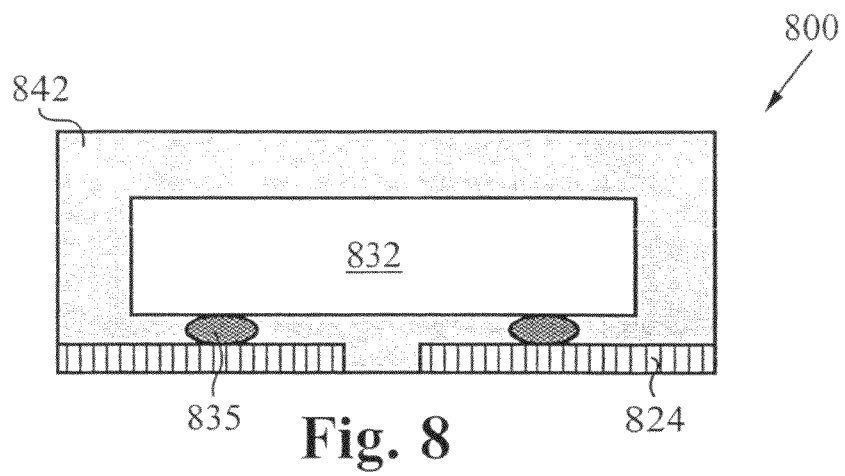

FIG. 8 illustrates that not only bond wires, but also solder balls 835 are (alternatively) applied for electrical connection between the die 832 and the contact pads 824 of alternative embodiments. This is also sometimes known as a flip chip style package.

Figure 9:
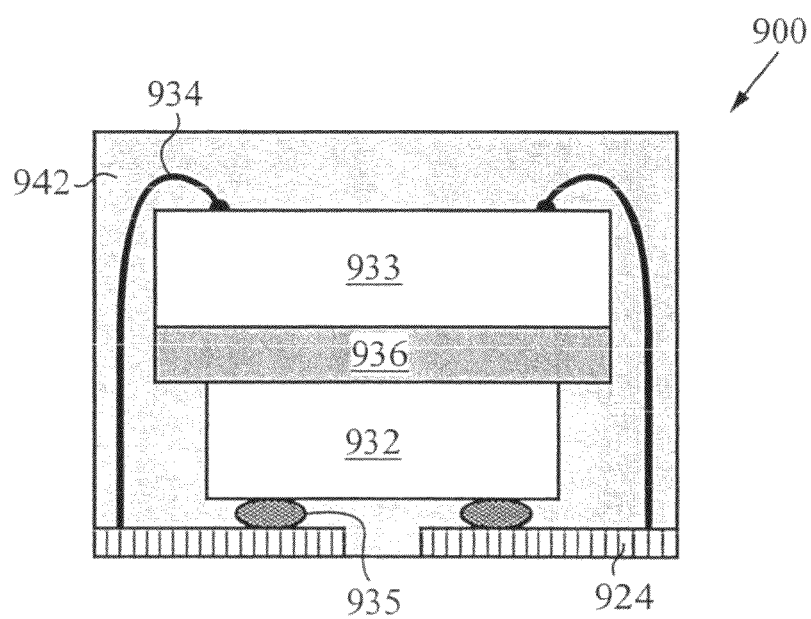

FIG. 9 illustrates that some embodiments have multiple dice 932 and 933, which are stacked by using a hybrid of flip chip and wire bond techniques. Accordingly, the die 932 is coupled to the contact pads 924 by using solder balls 935 in the flip chip style, while the die 933 is coupled to the contact pads 924 by using bond wires 934. Further, the die 932 is coupled to the die 933 by using an adhesive 936.

Stacked Die

Figure 10:
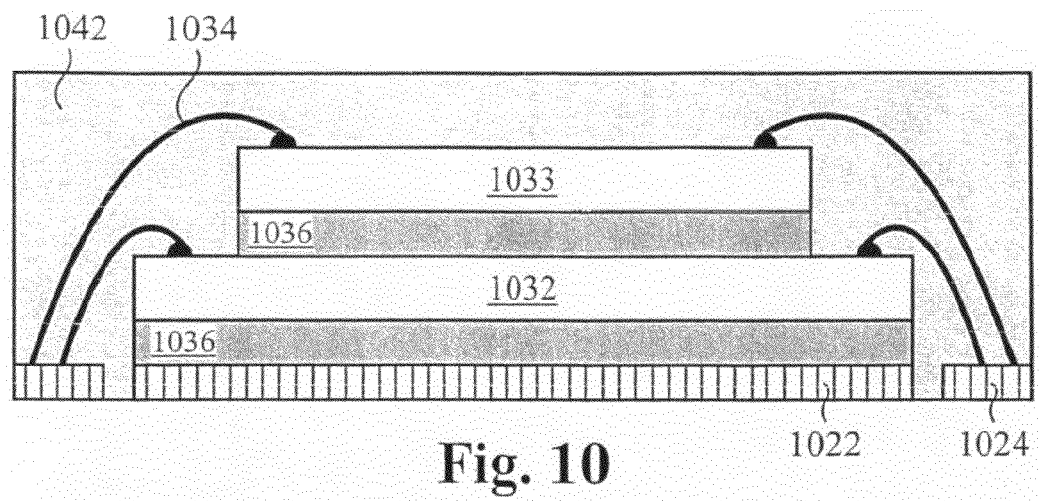
Figure 11:
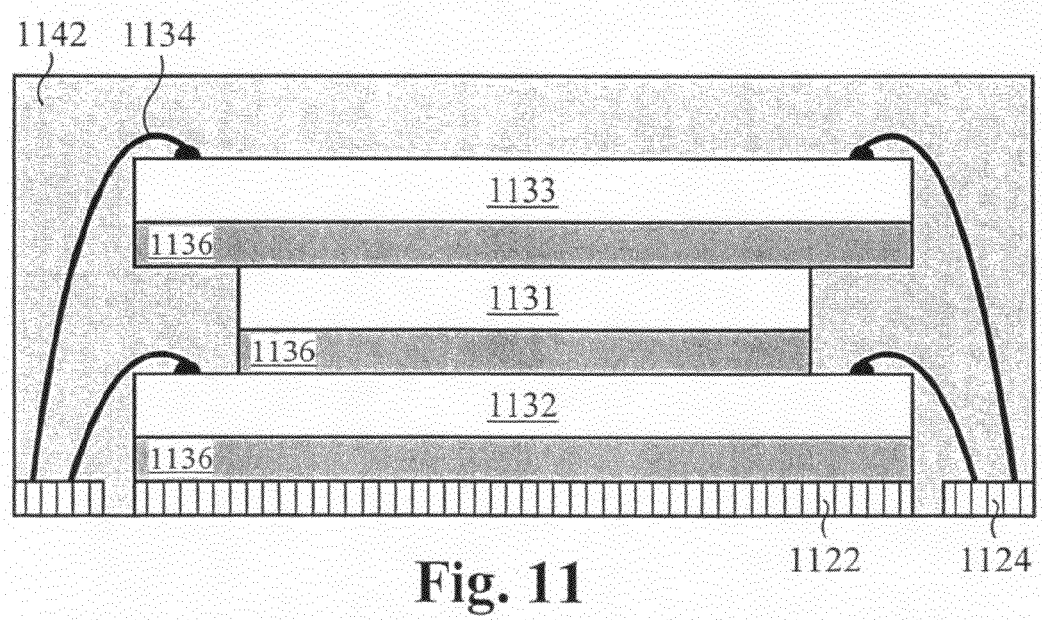
Figure 12:
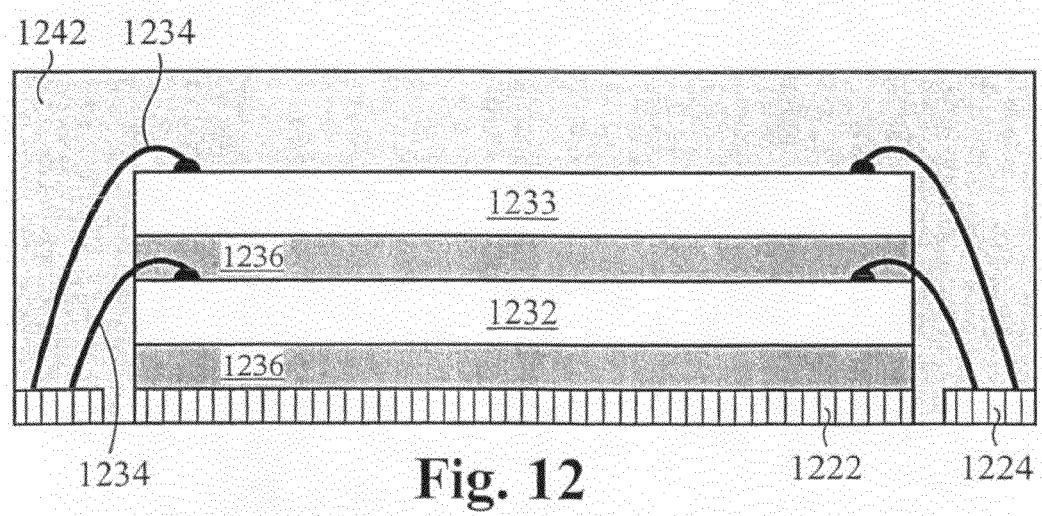

The packages of the embodiments described above further allow for a "stacked die" package configuration. Multiple and/or stacked die significantly increase the number of alternative configurations. FIGS. 10-12 illustrate some exemplary stacked die implementations in accordance with embodiments of the invention.

More specifically, FIG. 10 illustrates a daughter die 1033 that has a smaller size than a mother die 1032. As shown in this figure, the die 1033 is attached to the die 1032, which is attached to a die pad 1022. Typically, the attachment is by an adhesive 1036, while bonding wires 1034 couple the dice 1032 and 1033 to one or more contact pads 1024.

FIG. 11 illustrates a case where the daughter die 1133 and the mother die 1132 have the same approximate size. In these embodiments, a spacer die 1131 is advantageously inserted between the two stacked dice 1132 and 1133. As shown in the figure, the spacer die 1131 permits access to the die 1132 such that bond wires 1134 couple the die 1132 to the contact pads 1124.

FIG. 12 illustrates another option when the daughter die 1233 and the mother die 1232 have the same approximate size. In this configuration, an adhesive 1236 is applied directly between the two dice 1232 and 1233, instead of a spacer die. The adhesive 1236 of these embodiments includes an epoxy such as that used for die attach to a die pad, or another thermal, electrical, and/or adhesive material. As shown in FIG. 12, the adhesive advantageously permits access to the die 1232, such as by the bond wire 1234, for example.

IV. Bottom ("Floor Plan") Views

FIGS. 13-17 illustrate bottom views of the connector and/or mounting side of some of the packages described above.

More specifically, FIG. 13 illustrates a package 1300 that has contact pads 1324 at the sides of a die pad 1322. In this type of package 1300, the heat which is generated by the encapsulated semiconductor device (1332) during operation of the device (1332), is preferably transferred to the PCB via the die pad 1322. FIG. 13A illustrates the package 1300 of FIG. 13, with the contact pads 1324 at the edge of the package 1300.

FIG. 14 illustrates a package 1400 that has contact pads 1424 at the periphery of the die pad 1422. Moreover, these contact pads 1424 surround the die pad 1422 for achieving the benefit of higher pin counts in the small area of the package 1400. In FIG. 14, the contact pads 1424 are not at the edge of the package 1400, while in FIG. 14A, the contact pads 1424 are at the edge of the package 1400.

FIGS. 15 and 15A illustrate an alternative configuration for the die pad of FIG. 14. In FIG. 15, the die pad 1522 comprises a plated ring with an exposed center, while in FIG. 15A the die pad 1522 comprises a plated ring with a central plated portion attached to the ring with four connecting bars.

Figure 16:
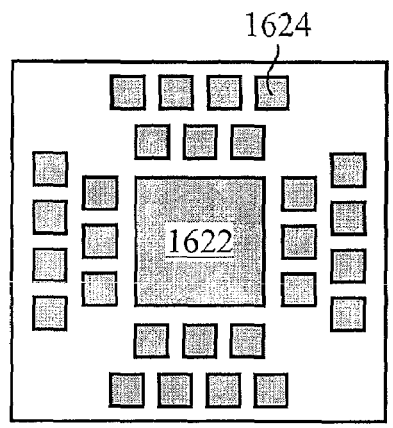
Figure 16A:
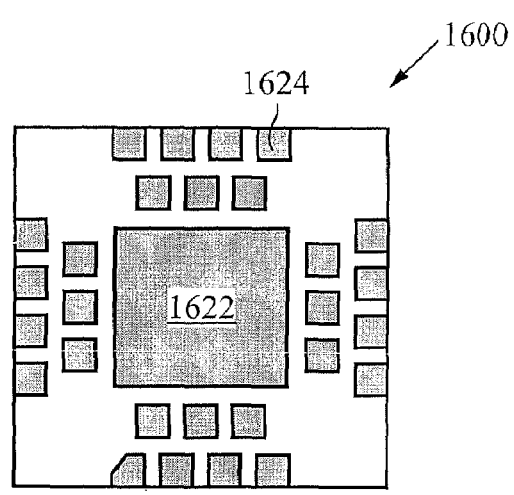
FIG. 16A illustrates the package of FIG. 15 with the outer most row of contact pads at the edge of the package.

FIG. 16 also illustrates contact pads 1624 at the periphery of the die pad 1622, but in more than one perimeter or circumference around the die pad 1622. This implementation typically yields even higher pin counts for the small package 1600.

Figure 17:
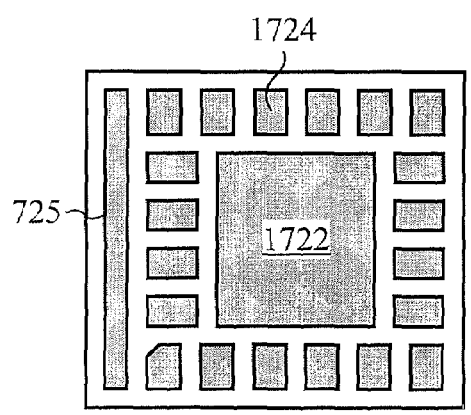
Figure 17A:
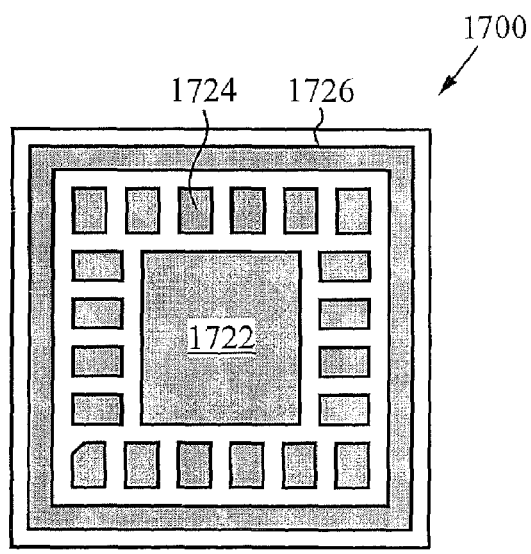
FIG. 17A illustrates a guard ring in accordance with some embodiments of the invention.

FIG. 17 illustrates contact pads 1724 at a periphery of the die pad 1722 with a security guard band 1725. As shown in this figure, some embodiments have only one guard band 1725. However, the package 1700 of other embodiments employ more than one guard band 1725. In fact, the guard band of some embodiments fully surrounds the die pad 1722, as a guard ring. FIG. 17A illustrates such an embodiment having contact pads 1724 at a periphery of the die pad 1722 with a security guard ring 1726.

The guard band 1725 and/or guard ring 1726 of these embodiments take advantage of and/or enable reduced contact pad height. As mentioned above, the contact pad height of some embodiments is zero, or almost zero. Some applications in the security field require an "unable" to test signal from the bottom of the package after installing the package on a PCB. The security guard band and/or ring is an additional (double) security measure that protects against having an open space, and/or separation of the package from the PCB during the insertion of a test signal probe between the (bottom of the) package and the PCB upon which the package is typically (surface) mounted. More specifically, the additional plated and/or metal soldering area for securing the package to the PCB, protects the contact pads and/or die pad of the package from undesirably separating from the PCB during handling, test, or another similar type of operation.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of packaging comprising:
   a. plating a plurality of first areas on a metal layer, wherein each of the first areas comprise a first palladium layer, a nickel layer, a second palladium layer and a gold layer, wherein the gold layer is on the metal layer, the second palladium layer is on the gold layer, the nickel layer is on the second palladium layer and the first palladium layer is on the nickel layer such that the gold layer is exposed at the bottom of the first areas when the metal layer is removed;
   b. plating a plurality of second areas of the metal layer;
   c. mounting one or more dies to each of the first areas plated on the metal layer with an adhesive;
   d. bonding at least one wire, the wire coupling each die of the dies to at least one second area;
   e. encasing the metal layer, the dies and the plurality of first and second areas in a mold compound thereby forming a molded block;
   f. removing the metal layer from the molded block, such that the first and second areas are exposed; and
   g. singulating the molded block after removal of the metal layer thereby forming individual packages;
   wherein the plurality of second areas are contact pads that are plated such that a different one of the contact pads is adjacent to each side of the one or more dies and has sufficient length such that the contact pad extends along the entire length of the each side of the one or more dies.

2. The method of claim 1, wherein the first plated area comprises a die attach pad.

3. The method of claim 1, wherein the first plated area comprises a contact pad.

4. The method of claim 1, wherein removing the metal layer comprises etching away the metal layer, without removing the plated regions such that the plated regions are exposed at an exterior surface of the package.

5. The method of claim 1, further comprising testing the molded block.

6. The method of claim 5, wherein testing the molded block comprises a parallel process for a plurality of devices within the molded block.

7. The method of claim 1, further comprising singulating a molded package from the molded block.

8. The method of claim 1, the plating having a plurality of layers comprising palladium, nickel, and gold.

9. The method of claim 1, further comprising exposing one or more of the second plated areas at a side surface of the package that is non-parallel with the bottom of the package, wherein the second plated area is for forming a contact pad that is accessible at the side surface.

10. The method of claim 1, further comprising encapsulating the second plated area at a side surface of the package.

11. The method of claim 1, further comprising plating a plurality of third areas such that each third area extends at least partially around one of the first plated areas, the one of the first plated areas comprising a die pad, the third plated area comprising a band near a perimeter of the die pad.

12. The method of claim 11, wherein each of the third plated areas comprise a ring surrounding the die pad of the one of the first plated areas.

13. The method of claim 1, wherein each of the one or more dies have a width dimension greater than a dimension of each of the first plated areas, such that the die overhangs the first plated area.

14. The method of claim 1, wherein each of the first plated areas comprise a first contact pad, and each of the second plated areas comprise a second contact pad, wherein one of the dies is coupled to the first and second contact pads without the need for a die pad, such that space required by the package is conserved.

15. The method of claim 14, wherein the size of the package closely approximates the size of the die.

16. The method of claim 1, wherein the bonding comprises using a bonding wire for coupling the die to the second plated area.

17. The method of claim 1, wherein the bonding comprises using a solder ball for coupling the die to the second plated area.

18. The method of claim 1, further comprising forming a plurality of contact pads for forming a row of contact pads near a perimeter of a die pad.

19. The method of claim 1, further comprising forming a plurality of contact pads surrounding a die pad.

20. The method of claim 19, further comprising forming a guard band or a guard ring.

21. A method of making a semiconductor device comprising the steps:
   a. plating a ring onto a metal substrate, wherein the ring is a continuous band;
   b. plating a plurality of contact pads onto the metal substrate, wherein the contact pads at least partially surround the ring;
   c. directly coupling a semiconductor die with the ring such that the semiconductor die is not above a die attach pad;
   d. mounting a plurality of bondwires to the semiconductor die and the contact pads;
   e. at least partially encasing the semiconductor die in a mold compound;
   f. etching away the metal substrate, thereby exposing the ring and plurality of contact pads; and
   g. singulating the at least partially encased semiconductor die after sacrificing the metal substrate thereby forming an individual package.

22. The method of claim 21 wherein the plurality of contact pads are plated such that a different one of the contact pads is adjacent to each side of the die and has sufficient length such that the contact pad extends along the entire length of the side of the die.

23. A method of making a semiconductor device comprising the steps:
   a. plating a plurality of contacts pads onto a metal substrate;
   b. attaching a semiconductor die to the metal substrate by applying adhesive between the plurality of contact pads, wherein an outermost perimeter of the semiconductor die is aligned so as to form a line with inner edges of the contact pads, wherein the line is perpendicular to a top surface of the semiconductor device, and further wherein the outermost perimeter of the adhesive is abutted to the inner edges of the contact pads;
   c. mounting a plurality of bondwires to the semiconductor die and the contact pads;
   d. at least partially encasing the semiconductor die in a mold compound; and
   e. sacrificing the metal substrate, thereby exposing the contact pads.

24. The method of claim 1, wherein the gold layer has a thickness of at least 50 angstroms, the second palladium layer has a thickness of at least 0.1 micrometers, the nickel layer has a thickness of at least 0.5 micrometers and the first palladium layer has a thickness of at least 0.5 micrometers.

25. The method of claim 21, wherein the ring and the contact pads do not protrude from a bottom surface of the mold compound, and wherein the entirety of the metal substrate is etched away.

* * * * *